United States Patent
Inada et al.

(10) Patent No.: US 8,378,300 B2
(45) Date of Patent: Feb. 19, 2013

(54) NEAR-INFRARED IMAGING SENSOR (75) Inventors: Hiroshi Inada, Osaka (JP); Youichi Nagai, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 367 days.

(21) Appl. No.: 12/689,550

(22) Filed: Jan. 19, 2010

(65) Prior Publication Data
US 2010/0181484 A1  Jul. 22, 2010

(30) Foreign Application Priority Data
Jan. 22, 2009 (JP) ................. 2009-011862

(51) Int. Cl.
*G01J 5/02* (2006.01)
(52) U.S. Cl. ....................................... 250/332
(58) Field of Classification Search ............. 250/332
See application file for complete search history.

(56) References Cited

U.S. PATENT DOCUMENTS

| | | | | |
|---|---|---|---|---|
| 6,844,606 B2* | 1/2005 | Logsdon et al. | ............. | 257/434 |
| 7,425,881 B2* | 9/2008 | Shibata | ......................... | 333/193 |
| 2003/0167851 A1* | 9/2003 | Parker | ............................. | 73/720 |
| 2007/0264835 A1* | 11/2007 | Iguchi et al. | .................. | 438/717 |
| 2008/0142714 A1* | 6/2008 | Nagai et al. | .................... | 250/332 |

FOREIGN PATENT DOCUMENTS

| | | | |
|---|---|---|---|
| GB | 2310952 A | * | 9/1997 |
| JP | 05-110959 | | 4/1993 |
| JP | 05-145089 | | 6/1993 |
| JP | 05-164922 | | 6/1993 |
| JP | 2002-247455 | | 8/2002 |
| JP | 2003-254820 | | 9/2003 |
| JP | 2004-127977 | | 4/2004 |

OTHER PUBLICATIONS

JP, 2003-254820, A (Sep. 10, 2003) machine translation.*
M. Nakayama, "Sekigaisen Kenshutsusoshi no Gijutsu DoKo", Sensor Technology, vol. 9, No. 3 pp. 61-64, Mar. 1989.

* cited by examiner

*Primary Examiner* — Constantine Hannaher
(74) *Attorney, Agent, or Firm* — Venable LLP; Michael A. Sartori; Tamatane J. Aga

(57) ABSTRACT

A near-infrared imaging sensor according to the present invention includes a photodiode array sensitive to light with a wavelength of 1.2 to 3 μm and a multiplexer including a signal readout circuit. The near-infrared imaging sensor is contained in a housing and is vacuum-sealed. The housing includes a main body section and a lid covering the main body section. The lid is made of a material transparent to light with a wavelength of 1.2 to 3 μm.

8 Claims, 8 Drawing Sheets

Concentric circles (varying in pitch and thichness (width))

FIG. 9B

Dots arranged at wavelength-order pitch

FIG. 9C

Diffractive optical elements (doe pattern) arranged on surface

NEAR-INFRARED IMAGING SENSOR

BACKGROUND OF THE INVENTION

1. Field of the Invention

The present invention relates to a near-infrared imaging sensor sensitive to near-infrared light.

2. Description of the Related Art

Infrared absorption bands of living organisms, foods, and the like are in the near-infrared range and therefore near-infrared imaging sensors are expected to be used for various applications in many surrounding fields. A known compound semiconductor which is sensitive to near-infrared light and which operates at room temperature is Indium gallium arsenide (InGaAs), which can detect light with a wavelength of up to 1.7 μm and is insensitive to light with a wavelength of more than 1.7 μm. Light with a wavelength of more than 1.7 μm can be detected with lead sulfide (PbS) and mercury cadmium telluride (HgCdTe, or MCT), which have low sensitivity and need to be cooled as disclosed in a non-patent document such as Masao Nakayama, "Sekigaisen Kenshutsusoshi no Gijutsu DoKo", *Sensor Technology*, vol. 9, no. 3 (March 1989), pp. 61-64.

For actual devices, such as image pickup devices, using visible light, cost efficiency and reduction in size and weight are important factors. Many techniques, in which wavelength ranges are limited, have been proposed for reduction in size and weight. Some of the techniques are exemplified below.

(1) A solid-state image pickup device including a cylindrical housing containing an image pickup element such as a charge-coupled device (CCD) or a complementary metal-oxide semiconductor (CMOS) sensor and a lens (Japanese Unexamined Patent Application Publication No. 2002-247455).

(2) A configuration in which a transparent cover has a hologram so as to have a simple structure and so as to be capable of color recognition (Japanese Unexamined Patent Application Publication No. 5-164922).

(3) An image pickup device including a housing having a glass lid having a circular zone plate for reduction in size and weight (Japanese Unexamined Patent Application Publication No. 5-110959).

According to Techniques (1) to (3), a certain reduction in size and weight is available.

The above techniques have unsolved problems, which are as summarized below.

(1) and (2): (i) Since an image sensor used requires an optical lens, a filter, and the like, an image pickup system is complicated and has a large size. (ii) Since an increased number of components are necessary and high alignment accuracy is required to assemble a complicated structure, stable manufacture is difficult and yield is low.

(3): The glass lid has an infrared absorption peak resulting from the vibration of hydroxyls in the 2-μm band. It is difficult to use glass to fabricate a micro-structure with high precision. Therefore, light fluctuates depending on the wavelength thereof and cannot pass through such a micro-structure.

SUMMARY OF THE INVENTION

It is an object of the present invention to provide a near-infrared imaging sensor which is simple in structure, which can uniformly transmit near-infrared light without depending on the wavelength, and which can be manufactured at high yield with high reproducibility. It is another object of the present invention to provide a method for manufacturing such a near-infrared imaging sensor.

A near-infrared imaging sensor according to the present invention includes a photodiode array sensitive to light with a wavelength of 1.2 to 3 μm and a signal readout circuit and is contained in a housing. The near-infrared imaging sensor is vacuum-sealed. The housing includes a main body section and a lid covering the main body section. The lid is made of a material transparent to light with a wavelength of 1.2 to 3 μm. The "transparent" as used herein means that the transmittance of light is 50% or more.

(E1) Since the lid is transparent to light with a wavelength of 1.2 to 3 μm, the near-infrared imaging sensor can uniformly transmit near-infrared light, which is used to detect components present in living organisms, foods, or the like.

(E2) The removal of moisture by vacuum sealing can prevent near-infrared light from passing nonuniformly through the near-infrared imaging sensor because of the absorption of near-infrared light by moisture. In the infrared range, water has a first absorption band having an absorption peak centered at about 1.4 μm, a second absorption band having an absorption peak centered at about 1.9 μm, and a third absorption band which has a broad absorption peak centered at about 2.9 μm and which ranges from 2.3 to 3 μm. Vacuum sealing can eliminate a variation or error factor due to the absorption of near-infrared light by water from the near-infrared imaging sensor.

(E3) The near-infrared imaging sensor is simple structure and can be manufactured at high yield with high reproducibility.

Therefore, the near-infrared imaging sensor can be advantageously used in the field of detectors for living organisms, foods, and the like.

The lid may include a membrane structure having a piezoelectric resistor. According to this configuration, the pressure in the housing can be detected by measuring the distortion of the membrane structure or the change in the piezoelectric resistance of the membrane structure. This allows the deterioration of vacuum sealing to be detected. Therefore, a near-infrared image can be prevented from being deteriorated by residual moisture.

The main body section of the housing and the lid may be made of a nonorganic material and the lid may be fixed to the main body section of the housing with an adhesive that is nonorganic. This can prevent gas from being emitted from walls of the housing in a vacuum-sealed state. Most of organic materials emit gases, including moisture, having absorption bands in the infrared range. The use of metal or ceramic, which is an example of the nonorganic material, allows such an unrecognizable error factor as described above to be eliminated.

The lid and the main body section of the housing are bonded together with a eutectic alloy. This allows the lid and the main body section of the housing to be made of a material with a heat resistance of 250° C. or higher. The lid and the main body section of the housing may be bonded together with, for example, a silver (Ag)-tin (Sn) eutectic alloy melting at a temperature of 220° C. to 240° C. Therefore, the near-infrared imaging sensor can be manufactured without causing heat damage to an optical system.

The main body section of the housing is preferably made of a Cu—W alloy and/or AlN. The Cu—W alloy and AlN have high thermal conductivity and therefore can dissipate heat generated from the photodiode array and signal readout circuit.

The lid may be made of silicon. Silicon is transparent to light with a wavelength of 1.2 to 3 μm and therefore can uniformly transmit near-infrared light.

The lid made of silicon may have at least one of a lens and a filter on the upper surface and/or back surface thereof. Silicon has a refractive index greater than that of resin or glass and therefore the use of silicon allows the lens to have a reduced size. The high refractive index of silicon allows contaminants in foods or drugs to be detected with an in-line near-distance imaging system. For silicon, a high-performance optical element such as a fine diffraction grating can be formed monolithically with the lid by an existing common semiconductor-processing technique. This allows the near-infrared imaging sensor to have a reduced size.

The photodiode array includes an InP substrate and a light-absorbing layer (or a light-receiving layer) which is disposed on the InP substrate and which has a band gap wavelength of 1.65 to 3.0 µm. The light-absorbing layer may be made of GaInNAsP, GaInNAsSb, or GaInNAs. The difference in lattice constant between the InP substrate and GaInNAsP, GaInNAsSb, or GaInNAs is 0.2% or less.

The photodiode array includes an InP substrate and a light-absorbing layer which is disposed on the InP substrate and which has a band gap wavelength of 1.65 to 3.0 µm. The light-absorbing layer may have a type-II multiquantum well structure containing GaAsSb/InGaAs, GaAsSb/InGaAsN, GaAsSb/InGaAsNP, or GaAsSb/InGaAsNSb. The difference in lattice constant between the InP substrate and GaAsSb/InGaAs, GaAsSb/InGaAsN, GaAsSb/InGaAsNP, or GaAsSb/InGaAsNSb is 0.2% or less.

The photodiode array, which has one of the above two configurations, has high, flat responsivity to light with a wavelength of 1.2 to 3 µm. Therefore, clear image sensing can be performed at high accuracy using light with a wavelength of 1.2 to 3 µm.

According to the present invention, the following sensor can be obtained: a near-infrared imaging sensor which is simple in structure, which can uniformly transmit near-infrared light without depending on the wavelength thereof, and which can be manufactured at high yield with high reproducibility.

DESCRIPTION OF THE PREFERRED EMBODIMENTS

Figure 1:
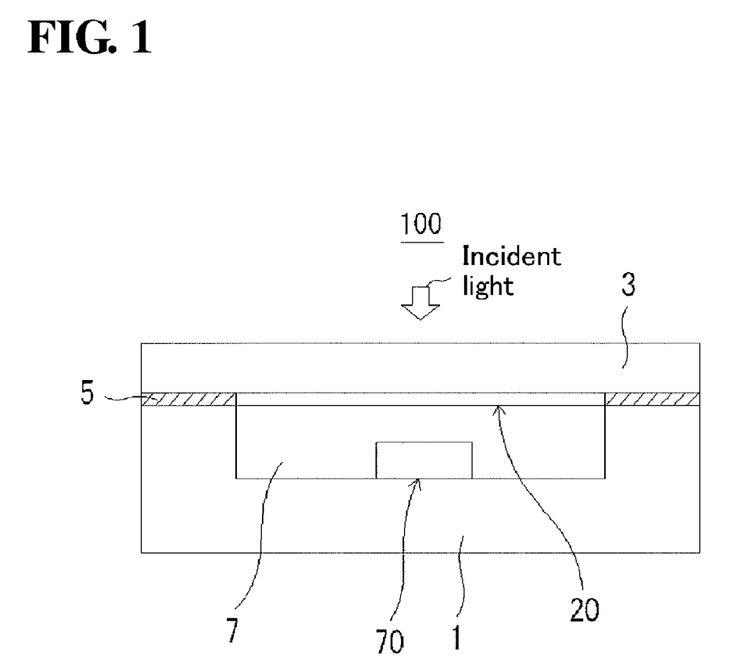
FIG. 1 is a sectional view of a near-infrared imaging sensor according to an embodiment of the present invention.

FIG. 1 is a sectional view of a near-infrared imaging sensor 100 according to an embodiment of the present invention. A sensor chip-mounted body 70 includes a photodiode array 50 and a multiplexer 71 which is a signal readout circuit (ROIC) and is fixed on the bottom of a housing main body section 1. The housing main body section 1 is, for example, a blind cylinder such as a blind circular cylinder or angular tube. The housing main body section 1 has an opening located on the light-incident side and the opening is covered with a lid 3. The lid 3 is fixed to the housing main body section 1 with a fixing member 5 made of a solder such as a tin (Sn) eutectic alloy. An inner space 7 is vacuum-sealed; hence, the fixing member 5 needs to have sufficient strength and durability. The lid 3 is made of silicon (Si) and has an optical component 20 disposed on an inner surface thereof.

Figure 2:
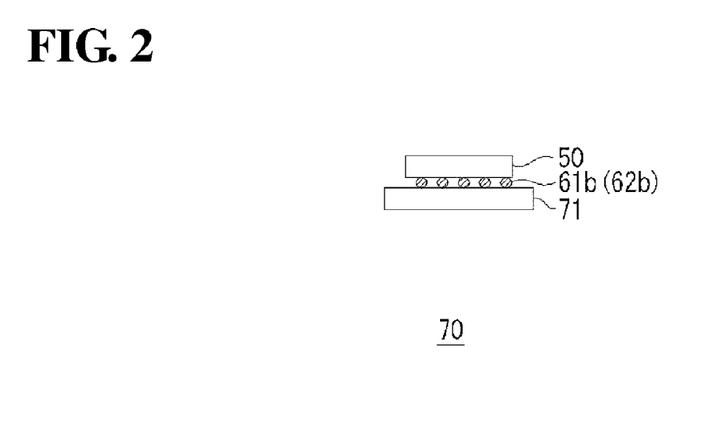
FIG. 2 is a schematic view of a sensor chip-mounted body included in the near-infrared imaging sensor shown in FIG. 1.
Figure 3:
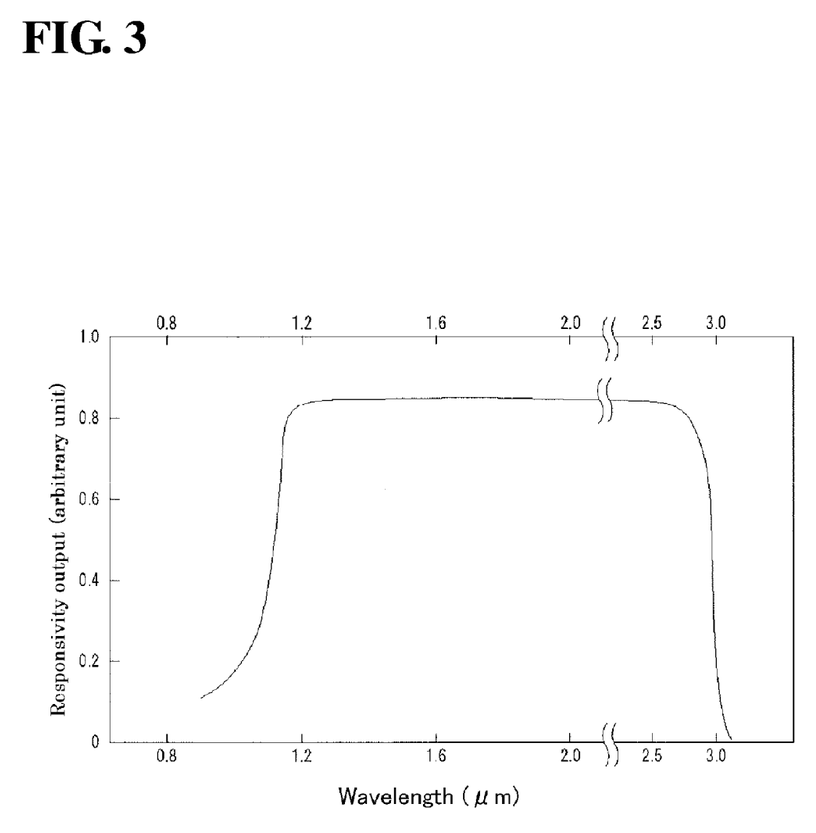
FIG. 3 is a graph showing the wavelength dependence of the responsivity output of a sensor chip-mounted body used in an embodiment of the present invention.

FIG. 2 is a schematic view of the sensor chip-mounted body 70. In the sensor chip-mounted body 70, the photodiode array 50 and the multiplexer 71 are bonded together with solder bumps 61b (62b). The photodiode array 50 includes photodiodes which are disposed above an indium phosphide (InP) substrate 51, which include a light-receiving layer 53 with a band gap wavelength of 1.2 to 3 µm, and which are one- or two-dimensionally arrayed. The sensor chip-mounted body 70 has wavelength-dependence of responsivity output as shown in FIG. 3. The sensor chip-mounted body 70 is characterized in that the responsivity output thereof is widely uniform over a wavelength range from 1.2 to 3 µm. In order to allow the photodiode array 50 to have high responsivity over such a near-infrared wavelength range, the light-receiving layer 53 needs to be special. The photodiode array 50 is described below in detail.

A first feature of the near-infrared imaging sensor 100 is as described below.

1. Vacuum Sealing

Figure 4:
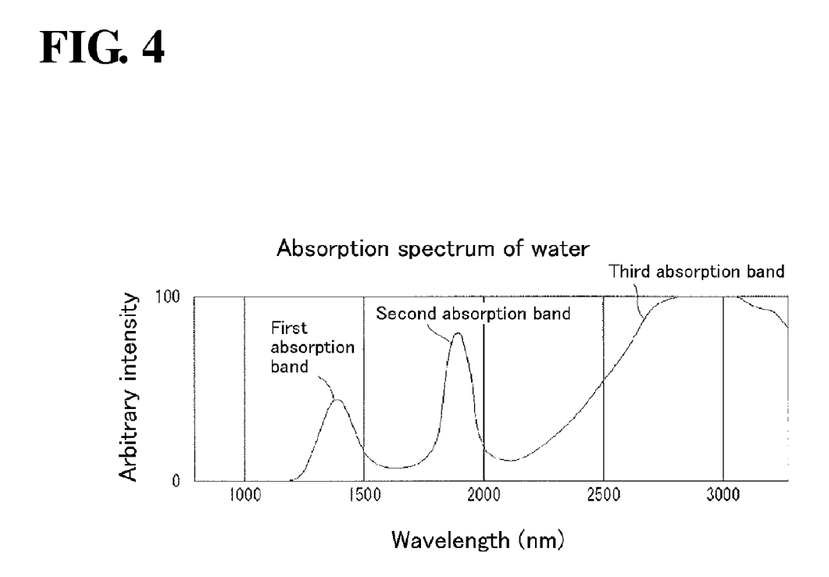
FIG. 4 is a graph showing the absorption spectrum of water.

The inner space 7 is vacuum-sealed so as not contain moisture. This allows near-infrared light to be prevented from being absorbed by moisture. FIG. 4 is a graph showing the absorption spectrum of water. In the infrared range, water has a first absorption band having an absorption peak centered at about 1.4 µm, a second absorption band having an absorption peak centered at about 1.9 µm, and a third absorption band which has a broad absorption peak centered at about 2.9 µm and which ranges from 2.3 to 3 µm. As shown in FIG. 3, the responsivity output of the sensor chip-mounted body 70 is flat and high in the infrared range. The absorption of near-infrared light by water shown in FIG. 4 inhibits the performance of the sensor chip-mounted body 70 shown in FIG. 3. Vacuum sealing can eliminate a variation or error factor due to the absorption of near-infrared light by water from the near-infrared imaging sensor 100.

In order to secure this operation and in order to maintain vacuum sealing, the near-infrared imaging sensor 100 has a configuration below.

(1-i) The lid 3 is made of silicon that is transparent to light with a wavelength of 1.2 to 3 µm.

(1-ii) The lid 3 and the housing main body section 1 are bonded together with a silver (Ag)—Sn solder (alloy), which is a eutectic alloy, and are made of a material with with a heat resistance of 250° C. or higher. Since the Ag—Sn solder (alloy), which is a Sn-based solder, is melted at a temperature of 220° C. to 240° C., the lid 3 and the housing main body section 1 need to have such heat resistance.

(1-iii) The lid 3 and the housing main body section 1 are made of a nonorganic material. This is because an organic component is prevented from being emitted from the lid 3 or inner walls of the housing main body section 1 into the inner space 7, which is vacuum-sealed. Organic materials heated to a temperature higher than room temperature emit organic components, which usually have absorption bands in a wavelength range from 1.2 to 3 μm. The presence of such an organic component in the inner space 7 leads to a reduction in detection accuracy.

In order to monitor the vacuum sealing of the inner space 7 over a long period of time, the near-infrared imaging sensor 100 may further include components below.

Figure 5:
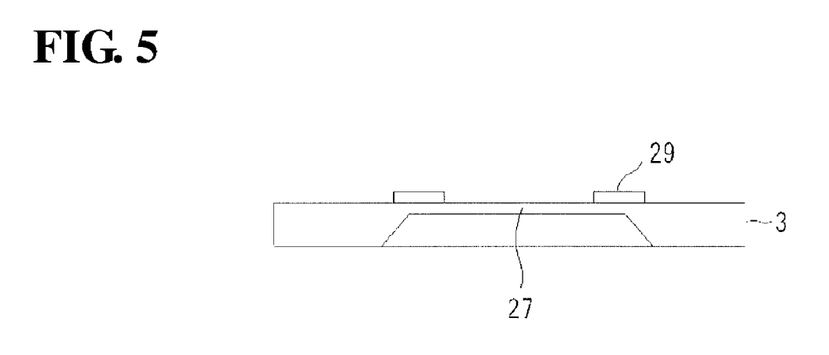
FIG. 5 is an illustration showing a membrane structure present in a lid and a piezoelectric resistor.

(1-iv) As shown in FIG. 5, a membrane structure 27 is present in a small portion of the lid 3 and an electric circuit including a piezoelectric resistor 29 is placed on the membrane structure 27, whereby the strain of the membrane structure 27 is monitored. Suppose the state of the piezoelectric resistor 29 immediately after the vacuum sealing thereof is normal. A reduction in the degree of vacuum relatively increases the pressure in the inner space 7 and therefore the membrane structure 27 is distorted so as to be outwardly convex. The reduction of the degree of vacuum is detected in such a manner that the distortion thereof is monitored with the piezoelectric resistor 29, whereby vacuum sealing and the like can be performed again. With reference to FIG. 5, the membrane structure 27 is shown to have a large area; however, the area percentage of the membrane structure 27 in the lid 3 may be small because an optical component is provided as described below. In order to detect the process in the inner space 7 with high sensitivity, the inner space 7 is preferably placed at the center of the lid 3.

(1-v) Strength for Maintaining Vacuum Sealing

In order to maintain vacuum sealing, the housing main body section 1 needs to have strength higher than a predetermined level. Therefore, the housing main body section 1 is a single piece formed by molding, has a thickness of about 2.5 mm, and is made of a copper (Cu)-tungsten (W) alloy. The lid 3 is made of silicon and has a thickness of about 1 mm. The Cu—W alloy has high thermal conductivity and therefore is effective in dissipating heat generated from the sensor chip-mounted body 70. Aluminum nitride (AlN) also has high thermal conductivity and therefore may be used to form a region around the sensor chip-mounted body 70 such that heat is dissipated. The sensor chip-mounted body 70 has a thickness of about 1 mm and a width of 10 to 15 mm (a side of a rectangle).

2. Photodiode Array

Figure 6:
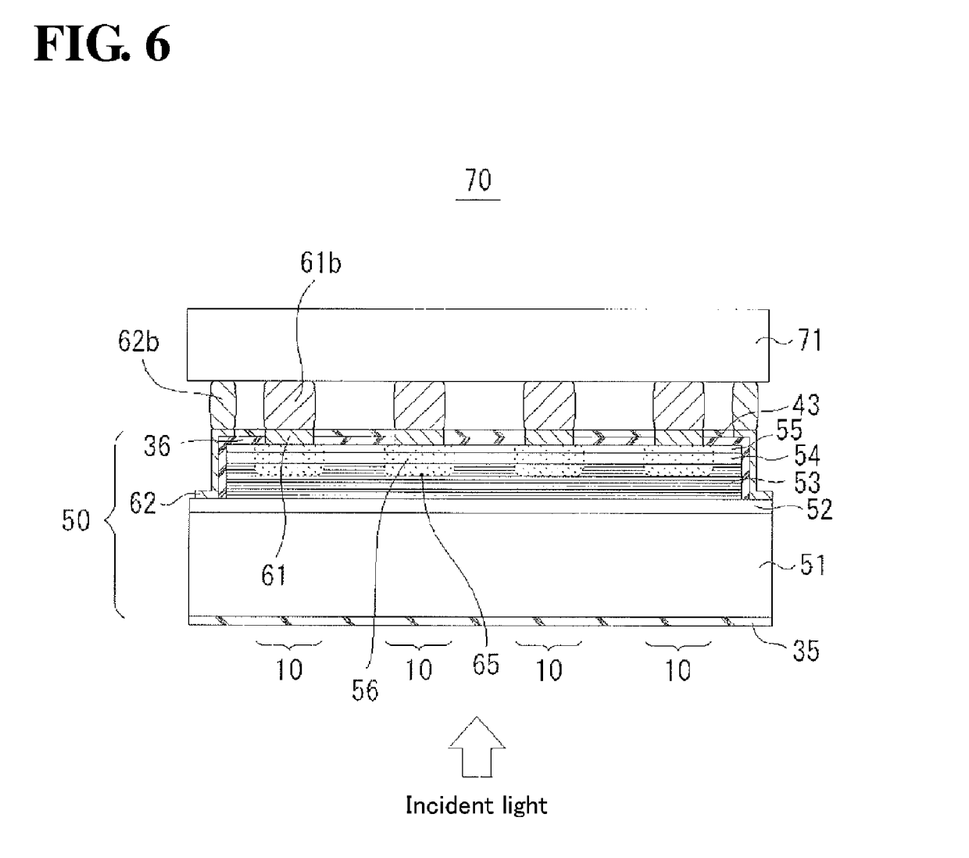
FIG. 6 is a sectional view of the sensor chip-mounted body shown in FIG. 2.

The photodiode array 50, which is a second feature of the near-infrared imaging sensor 100 is described below. FIG. 6 is an illustration showing the detailed configuration of the sensor chip-mounted body 70, which is shown in FIG. 2. The near-infrared imaging sensor 100 is a detector for near-infrared light. The multiplexer 71 may be a commercially available one. The multiplexer 71 includes a readout electrode, which is not shown. The photodiode array 50 includes positive (p)-side electrodes 61 connected to the readout electrode with the solder bumps 61b. The photodiode array 50 also includes negative (n)-side electrodes 62, serving as ground electrodes, connected to a common ground electrode, which is not shown, with the solder bumps 62b.

(2-i) Detailed Configuration of Photodiode Array

With reference to FIG. 6, the photodiodes each correspond to a pixel 10 and each have a Group III-V semiconductor multilayer structure (epitaxial wafer), disposed on the InP substrate 51, having the following configuration: the InP substrate 51/an n-type InP buffer layer 52/the light-receiving layer 53/a diffusive concentration distribution-adjusting layer 54/a window layer 55. The light-receiving layer 53 has a multiquantum well structure containing gallium arsenide antimonide (GaAsSb) and InGaAs or gallium indium nitride arsenide (GaInNAs).

P-type regions 56 extend from the window layer 55 to the light-receiving layer 53 and are formed in such a manner that zinc (Zn), which is a p-type impurity, is selectively diffused through openings disposed in a selective diffusion mask pattern 36 including a silicon nitride (SiN) film. The use of the selective diffusion mask pattern 36 allows Zn to be selectively diffused inside the periphery of the pixel 10 in a two-dimensionally defined way. The selective diffusion mask pattern 36 is covered with a polyimide protective layer 43.

The p-side electrodes 61 are made of gold-zinc (AuZn) and are each disposed on a corresponding one of the p-type regions 56 so as to form an ohmic contact. The n-side electrodes 62 are made of gold-germanium-nickel (AuGeNi) and are disposed on a corresponding one of the n-type InP buffer layer 52 so as to form an ohmic contact. The n-type InP buffer layer 52 is doped with an n-type impurity and therefore has a predetermined level of electrical conductivity. An anti-reflection film 35 made of silicon oxide nitride (SiON) is disposed on the back surface of the InP substrate 51 such that light can enter the back surface of the InP substrate 51.

In the light-receiving layer 53, pn junctions 65 are arranged at positions corresponding to boundary fronts of the p-type regions 56. Depletion layers are created by applying reverse bias voltages between the p-side electrodes 61 and the n-side electrodes 62 so as to be wide on the side (n-type impurity background) where the concentration of the n-type impurity is low. The background of the light-receiving layer 53 has an n-type impurity concentration (carrier concentration) of about $5\times10^{15}$ cm$^{-3}$ or less. The positions of the pn junctions 65 are determined by intersections of the background (n-type carrier concentration) of the light-receiving layer 53 and the concentration profile of Zn, which is a p-type impurity. The diffusive concentration distribution-adjusting layer 54 is placed between the light-receiving layer 53 and the window layer 55 such that the electrical conductivity of the p-side electrodes 61 is maintained good. The diffusive concentration distribution-adjusting layer 54 is preferably made of InGaAs because InGaAs has relatively low band gap energy and therefore the electrical resistance thereof is prevented from being increased by the presence of the thickness portions (the predetermined thickness portions located on the light-receiving layer 53 side) having low impurity concentration.

The photodiode array 50 needs to have responsivity that is flat and high in the infrared to longer wavelength range. Therefore, the window layer 55 is preferably made of a material having band gap energy higher than that of the light-receiving layer 53. The window layer 55 is usually made of InP, which is a material that has band gap energy higher than that of the light-receiving layer 53 and has good lattice matching. The window layer 55 may be made of indium aluminum arsenide (InAlAs), which has band gap energy substantially equal to that of InP.

The light-receiving layer 53 preferably has a type-II multiquantum well structure. In a type-I multiquantum well structure, a semiconductor layer having low band gap energy is sandwiched between semiconductor layers having high band gap energy. For a photodiode having responsivity in the near-infrared range, the band gap of a semiconductor layer having low band gap energy determines the upper wavelength (cutoff wavelength) of responsivity. That is, the optical transition of electrons or holes is caused in the semiconductor layer having low band gap energy (direct transition). In this case, a material increasing the cutoff wavelength is very limited in a Group III-V compound semiconductor. In the type-II multiquantum well structure, when two types of different semiconductor layers having common Fermi energy are alternately arranged, a difference in energy between the conduction band of a first semiconductor and the valence band of a second semiconductor determines the upper wavelength (cutoff wavelength) of responsivity. That is, the optical transition of electrons or holes is caused between the valence band of the second semiconductor and the conduction band of the first semiconductor (indirect transition). Therefore, the energy of valence band of the second semiconductor is raised above that of the valence band of the first semiconductor and the energy of the conduction band of the first semiconductor is lowered below that of the conduction band of the second semiconductor. This is more effective in making the wavelength of responsivity longer as compared to direct transition in a single semiconductor.

(2-ii) Method for Fabricating Photodiode Array

The p-type impurity is selectively diffused inside the periphery of each pixel 10 in a two-dimensionally defined way using the selective diffusion mask pattern 36 as described above. This prevents the pn junctions 65 from being exposed at end surfaces of the pixels 10. Therefore, the leakage of photocurrents is suppressed. With reference to FIG. 6, a plurality of the pixels 10 are arranged with no isolation grooves therebetween. Each of the p-type regions 56 is limited inside a corresponding one of the pixels 10 and is securely isolated from the adjacent pixels 10.

The n-type InP buffer layer 52 or an n-type InGaAs buffer layer is formed on the InP substrate 51 so as to have a thickness of 2 μm. The light-receiving layer 53 is then formed so as to have an InGaAs/GaAsSb or GaInNAs/GaAsSb multiquantum well structure. InGaAs has a composition represented by the formula $In_{0.53}Ga_{0.47}As$ and GaAsSb has a composition represented by the formula $GaAs_{0.52}Sb_{0.48}$ so as to be lattice-matched to InP. This allows the degree of lattice matching ($|\Delta\alpha/\alpha|$, where $\alpha$ is a lattice constant and $\Delta\alpha$ is the difference between lattice constants) to be 0.002 or less.

InGaAs layers (or GaInNAs layers) forming a unit quantum well structure have a thickness of 5 nm and the number of pairs thereof (the number of repeated unit quantum wells) is 300. An InGaAs layer is grown on the light-receiving layer 53 to have a thickness of 1 μm, whereby the diffusive concentration distribution-adjusting layer 54, which is used for the diffusion and introduction of Zn, is formed. The window layer 55 is finally epitaxially grown to have a thickness of 1 μm. The light-receiving layer 53 and the diffusive concentration distribution-adjusting layer 54 are preferably epitaxially grown by molecular beam epitaxy (MBE). The window layer 55 may be epitaxially grown by MBE or may be epitaxially grown by metal-organic vapor phase epitaxy (MOVPE) after the diffusive concentration distribution-adjusting layer 54 is grown and then taken out of an MBE system.

The InP substrate 51 is preferably a semi-insulating substrate containing iron (Fe) because good crystallinity is likely to be obtained. Since the InP substrate 51 is semi-insulating, the n-type InP buffer layer 52 or the n-type InGaAs buffer layer is preferably doped with a suitable amount of the n-type impurity for the purpose of making good electrical contact with the n-side electrodes 62. The n-type InP buffer layer 52 or the n-type InGaAs buffer layer is preferably doped with, for example, an n-type dopant such as Si at a dose of about $1 \times 10^{17}$ cm$^{-3}$. The light-receiving layer 53, the diffusive concentration distribution-adjusting layer 54, and the window layer 55 are preferably undoped and may be doped with an n-type dopant such as Si at a trace dose (for example, about $2 \times 10^{15}$ cm$^{-3}$). Alternatively, a heavily doped n-side electrode-forming layer, doped with an n-type dopant at a dose of $1 \times 10^{18}$ cm$^{-3}$, for forming the n-side electrodes 62 may be placed between the InP substrate 51 and the n-type InP buffer layer 52.

In FIG. 6, the pn junctions 65 should be broadly construed as described below. In the light-receiving layer 53, a region located on the side opposite to a surface doped with the p-type impurity, Zn, by selective diffusion has a low impurity concentration and therefore is a low-impurity concentration region (referred to as an i-region) which can be regarded as an intrinsic semiconductor. The pn junctions 65 include junctions between the i-region and the p-type regions 56, that is, pi junctions and may further include pi junctions having an extremely low p-type impurity concentration.

The p-type regions 56 are formed so as to extend the light-receiving layer 53, which has the InGaAs/GaAsSb (or GaInNAs/GaAsSb) multiquantum well structure, in such a manner that Zn is selectively diffused through the openings of the selective diffusion mask pattern 36, which is disposed on the window layer 55. Front end portions of the p-type regions 56 form the pn junctions 65.

The photodiode array 50 is that the adjacent photodiodes are isolated from each other by the selective diffusion (the diffusion of Zn inside the periphery of each photodiode in a two-dimensionally defined way) of Zn without performing mesa etching for isolation. Each of Zn selectively diffused regions 66 serves as a main portion of a corresponding one of the pixels 10 and regions where no Zn is diffused isolate the pixels 10 from each other. This prevents crystal damage due to mesa etching; hence, dark currents can be suppressed.

In the case of forming pn junctions by the selective diffusion of an impurity, there is a concern that the intervals between elements cannot be reduced to below a certain value because diffusion proceeds not only depthwise but also laterally (perpendicularly to depth). However, the actual selective diffusion of Zn has confirmed that in a structure including an InP window layer 55 located most outside and an InGaAs diffusive concentration distribution-adjusting layer 54 located thereunder, the degree of lateral diffusion is substantially equal to or less than that of depthwise diffusion. In the selective diffusion of Zn, Zn diffuses laterally out of openings arranged in a mask pattern to a slight extent. That is, as shown in FIG. 6, Zn diffuses slightly out of the openings of the selective diffusion mask pattern 36.

The InP substrate 51 is preferably an off-angle substrate inclined at an angle of five to 20 degrees in the [111] or [11-1] direction from the (100) direction and more preferably inclined at an angle of ten to 15 degrees in the [111] or [11-1] direction from the (100) direction. The use of such an off-angle substrate is effective in obtaining the n-type InP buffer layer 52, the light-receiving layer 53 having the type-II multiquantum well structure, the diffusive concentration distribution-adjusting layer 54, and the window layer 55, which have low defect density and good crystallinity.

A third feature of the near-infrared imaging sensor 100 is described below.

3. Optical Component 20 on Lid 3 Made of Silicon (3-i) Lens

Figure 7A:
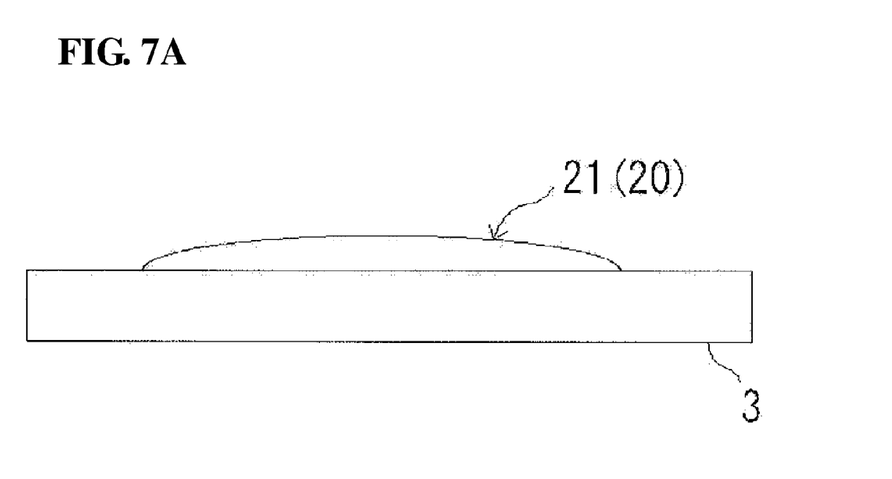
FIG. 7A is a sectional view of an ordinary lens placed on the lid.
Figure 7B:
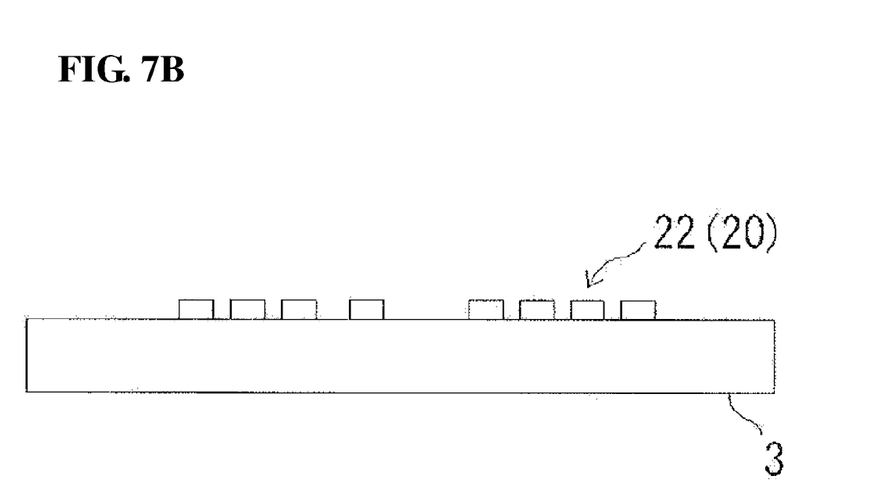
FIG. 7B is a sectional view of a Fresnel lens placed on the lid.

FIGS. 7A and 7B each shows an example in which a lens is placed on the lid 3, which is made of silicon. In particular, FIG. 7A shows an ordinary lens 21 and FIG. 7B shows a Fresnel lens 22. In the case of forming an image of an imaging object, one or more lenses are indispensable. The use of the ordinary lens 21 or the Fresnel lens 22 in combination with the lid 3 allows the near-infrared imaging sensor 100 to have a reduced size. The use of the Fresnel lens 22 allows the near-infrared imaging sensor 100 to have a reduced weight.

(3-ii) Filter

Figure 8A:
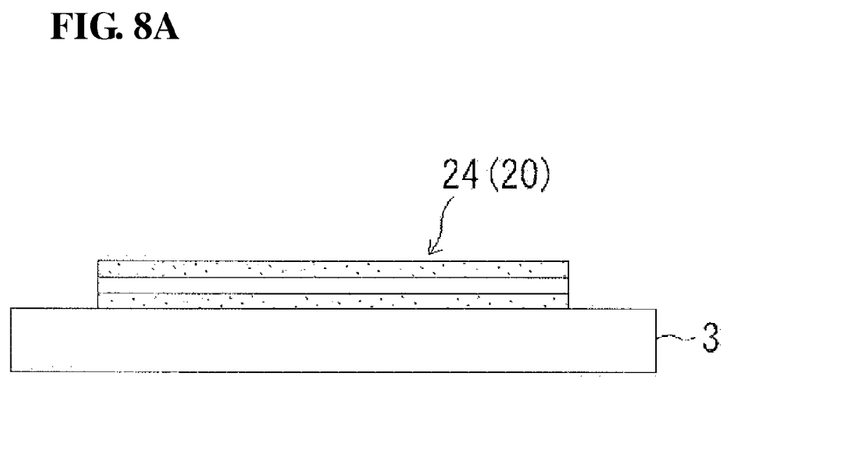
FIG. 8A is a sectional view of an optical multilayer film placed on the lid.
Figure 8B:
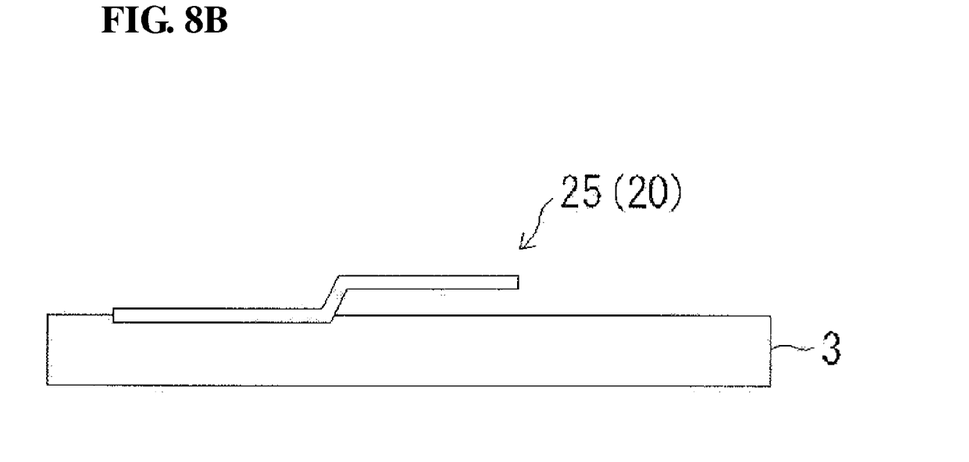
FIG. 8B is a sectional view of a MEMS Fabry-Perot resonator placed on the lid.

In the case of performing imaging using near-infrared light with a specific wavelength, a filter with high wavelength selectivity is indispensable. FIGS. 8A and 8B are sectional views of such filters. In particular, FIG. 8A shows an optical multilayer film 24 and FIG. 8B shows a microelectromechanical system (MEMS) Fabry-Perot resonator 25. The optical multilayer film 24, which is shown in FIG. 8A, can be reduced in the range of a selected wavelength and can be enhanced in selectivity by increasing the number of layers arranged therein. The MEMS Fabry-Perot resonator 25, which is shown in FIG. 8B, can be reduced in the range of a selected wavelength in such a manner that the resonance width thereof is narrowed by increasing the dimensional accuracy thereof. The use of such a filter in combination with the lid 3 allows the near-infrared imaging sensor 100 to have a simple structure and a reduced size.

(3-iii) Diffraction Grating Pattern

Figure 9A:
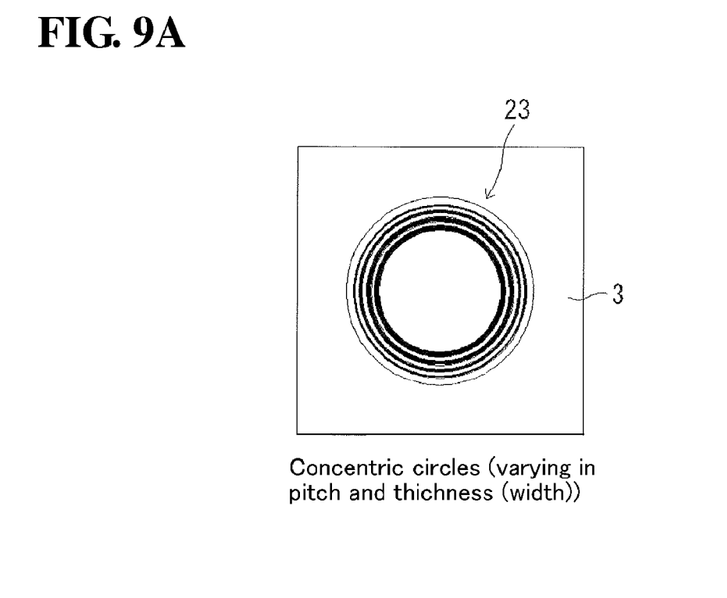
FIG. 9A is an illustration showing a concentric diffraction grating placed on the lid.
Figure 9B:
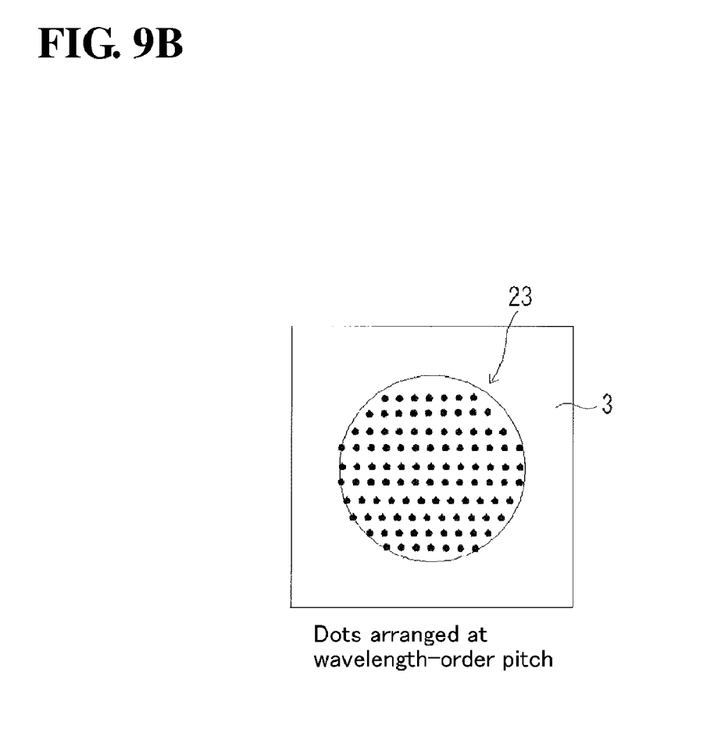
FIG. 9B is an illustration showing a diffraction grating, placed on the lid, having dots arranged at a wavelength-order pitch.
Figure 9C:
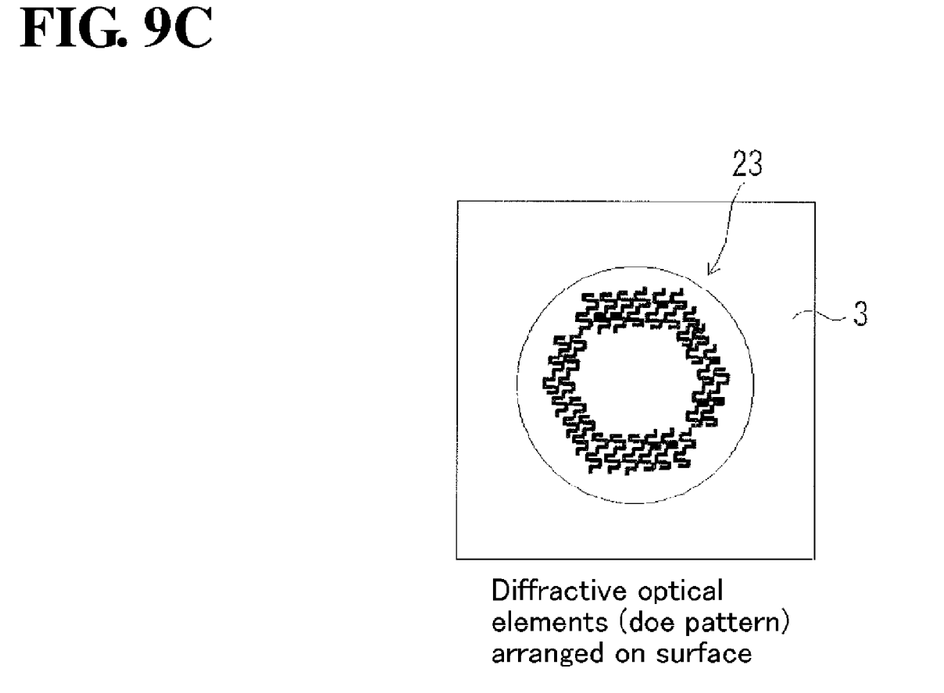
FIG. 9C is an illustration showing diffractive optical elements arranged on the lid.

FIGS. 9A, 9B, and 9C are illustrations each showing a diffraction grating 23 placed on an external or internal surface of the lid 3. Light is diffracted in different patterns depending on the wavelength thereof. Therefore, wavelength dependence can be detected by measuring the intensity at each pixel 10 if a position in the photodiode array 50 where the diffracted light reaches is known in advance.

FIG. 9A shows a concentric diffraction grating 23 capable of adjusting a diffraction pattern by varying the pitch between rings and/or the thickness (width) of the rings. FIG. 9B shows a diffraction grating 23 having dots arranged at a wavelength-order pitch. The use of the diffraction grating 23 having the dots is effective in increasing the degree of design freedom. That is, an available wavelength can be expanded in such a manner that the pitch between the dots arranged in a peripheral portion and that between the dots arranged in a central portion are arbitrarily set. FIG. 9c shows diffractive optical elements (DOEs) 23 arranged on a surface of the lid 3. The diffractive optical elements can have various functions such as lens functions, multiplexing/demultiplexing functions, light intensity distribution-converting functions, filtering functions, and diffraction pattern functions. A plurality of functions can be integrated in each of the elements. This allows the near-infrared imaging sensor 100 to have a reduced size and weight.

The near-infrared imaging sensor 100 has the following features as described above: 1. Vacuum sealing, 2. Photodiode array, and 3. Optical component on lid made of silicon. The implementation of these features greatly depends on the fact that the sensor chip-mounted body 70 has wavelength-dependence of responsivity output shown in FIG. 3. The sensor chip-mounted body 70 has the configuration shown in FIG. 6 and therefore has wavelength-dependence of responsivity output as shown in FIG. 3. The light-receiving layer 53, which has the type-II multiquantum well structure, is as described in detail with reference to FIG. 6. The light-receiving layer 53 may have a single-layer structure containing GaInNAs, gallium indium nitride arsenide antimonide (GaInNAsSb), and gallium indium nitride arsenide phosphide (GaInNAsP) instead of the type-II multiquantum well structure. The near-infrared imaging sensor 100 is not temperature-controlled as described in the above embodiment and may be temperature-controlled with a Peltier element.

While the present invention has been described with reference to the embodiments, the embodiments are for exemplification only and the scope of the present invention is not limited to the embodiments. The scope of the present invention is defined by the appended claims and encompasses all modifications equivalent to and within the scope of the appended claims.

According to the present invention, the following sensor can be obtained: a near-infrared imaging sensor which is simple in structure, which can uniformly transmit near-infrared light without depending on the wavelength thereof, and which can be manufactured at high yield with high reproducibility. Therefore, in the field of detectors for living organisms, drugs, foods, and the like, it is expected that simple, inexpensive devices capable of high-accuracy detection are provided.

What is claimed is:

1. A near-infrared imaging sensor which is contained in a housing and which is vacuum-sealed, comprising:
    a photodiode array sensitive to light with a wavelength of 1.2 to 3 μm; and
    a signal readout circuit,
    wherein the housing includes a main body section and a lid covering the main body section, the lid is made of a material transparent to light with a wavelength of 1.2 to 3 μm, the lid includes a membrane structure, an electric circuit including a piezoelectric resistor is provided on the membrane structure, the piezoelectric resistor has a normal state being a state of the piezoelectric resistor immediately after the housing is vacuum-sealed, and the piezoelectric resistor monitors a reduction in the vacuum of the housing compared to the normal state of the piezoelectric resistor.

2. The near-infrared imaging sensor according to claim 1, wherein the main body section of the housing and the lid is made of a nonorganic material and the lid is fixed to the main body section of the housing with an adhesive that is nonorganic.

3. The near-infrared imaging sensor according to claim 1, wherein the lid and the main body section of the housing are bonded together with an Ag—Sn alloy and are made of a material with a heat resistance of 250° C. or higher.

4. The near-infrared imaging sensor according to claim 1, wherein the main body section of the housing is made of a Cu—W alloy and/or AlN.

5. The near-infrared imaging sensor according to claim 1, wherein the lid is made of silicon.

6. The near-infrared imaging sensor according to claim 5, wherein the lid made of silicon has at least one of a lens and a filter on the upper surface and/or back surface thereof.

7. The near-infrared imaging sensor according to claim 1, wherein the photodiode array includes an InP substrate and a light-absorbing layer which is disposed on the InP substrate and which has a band gap wavelength of 1.65 to 3.0 μm, the light-absorbing layer is made of GaInNAsP, GaInNAsSb, or GaInNAs, and the difference in lattice constant between the InP substrate and GaInNAsP, GaInNAsSb, or GaInNAs is 0.2% or less.

8. The near-infrared imaging sensor according to claim 1, wherein the photodiode array includes an InP substrate and a light-absorbing layer which is disposed on the InP substrate and which has a band gap wavelength of 1.65 to 3.0 μm, the light-absorbing layer has a type-II multiquantum well structure containing GaAsSb/InGaAs, GaAsSb/InGaAsN, GaAsSb/InGaAsNP, or GaAsSb/InGaAsNSb, and the difference in lattice constant between the InP substrate and GaAsSb/InGaAs, GaAsSb/InGaAsN, GaAsSb/InGaAsNP, or GaAsSb/InGaAsNsB is 0.2% or less.

* * * * *